United States Patent
DeSalvo et al.

(10) Patent No.: US 8,897,607 B2
(45) Date of Patent: *Nov. 25, 2014

(54) TUNABLE RF FILTER DEVICE USING OPTICAL WAVEGUIDES WITH DISPERSION SLOPES OF OPPOSITE SIGNS AND RELATED METHODS

(75) Inventors: Richard DeSalvo, Satellite Beach, FL (US); Charles Middleton, Rockledge, FL (US)

(73) Assignee: Harris Corporation, Melbourne, FL (US)

( * ) Notice: Subject to any disclaimer, the term of this patent is extended or adjusted under 35 U.S.C. 154(b) by 558 days.

This patent is subject to a terminal disclaimer.

(21) Appl. No.: 13/189,768

(22) Filed: Jul. 25, 2011

(65) Prior Publication Data

US 2013/0028551 A1  Jan. 31, 2013

(51) Int. Cl.
*G02F 1/035* (2006.01)
*H04B 10/90* (2013.01)
*H03H 2/00* (2006.01)
*G02F 1/025* (2006.01)
*G02F 1/01* (2006.01)
*G02B 6/26* (2006.01)

(52) U.S. Cl.
CPC ............... *H03H 2/003* (2013.01); *G02F 1/025* (2013.01); *H04B 2210/006* (2013.01); *H04B 10/90* (2013.01); *G02F 1/011* (2013.01); *G02F 1/035* (2013.01); *G02B 6/26* (2013.01)
USPC ............... 385/2; 385/1; 385/3; 385/4; 385/5; 385/6; 385/7; 385/8; 385/9; 385/10; 385/11; 385/15; 385/27; 385/39; 385/40; 359/237; 359/238; 359/239; 359/245; 398/115; 398/140

(58) Field of Classification Search
CPC ....... G02F 1/00; G02F 1/0115; G02F 1/0128; G02F 1/0134; G02F 1/313; G02F 1/3131; G02F 1/3136; G02F 1/025; G02F 1/035; G02B 6/26; G02B 6/29355; G02B 6/29395; G02B 6/29394; G02B 6/2935; H04B 10/00; H04B 10/12; H04B 10/2507; H04B 10/2513; H04B 10/25133; H04B 10/25137; H04B 10/2519; H04B 10/2525; H04B 10/2569; H04B 10/2575
USPC ........ 385/1–11, 15, 27, 39–40; 359/237–239, 359/245; 398/115, 140–172
See application file for complete search history.

(56) References Cited

U.S. PATENT DOCUMENTS 5,404,413 A  *  4/1995  Delavaux et al. ................. 385/15
5,636,046 A     6/1997  Ishikawa et al. .............. 359/161

(Continued)

OTHER PUBLICATIONS

"Compact integrated Tunable Chromatic Dispersion Compensator with 4000 ps/nm Tuning range"; by Madsen et al; Optical Society of America, 2000.*

(Continued)

*Primary Examiner* — Ryan Lepisto
*Assistant Examiner* — Guy Anderson
(74) *Attorney, Agent, or Firm* — Allen, Dyer, Doppelt, Milbrath & Gilchrist, P.A.

(57) ABSTRACT

A tunable Radio Frequency (RF) filter device includes a tunable optical source configured to generate an optical carrier signal, and a modulator coupled to the tunable optical source and configured to modulate the optical carrier signal with an RF input signal. The tunable RF filter device may also include first and second optical waveguides coupled to the modulator and having first and second dispersion slopes of opposite sign, and an optical-to-electrical converter coupled to the first and second optical waveguides and configured to generate an RF output signal with a frequency notch therein based upon the tunable optical source.

15 Claims, 4 Drawing Sheets

(56) References Cited

U.S. PATENT DOCUMENTS

| | | | |
|---|---|---|---|
| 6,016,371 A * | 1/2000 | Wickham et al. | 385/10 |
| 6,252,687 B1 | 6/2001 | Ishikawa et al. | 359/124 |
| 6,252,688 B1 | 6/2001 | Ishikawa et al. | 359/124 |
| 6,330,254 B1 * | 12/2001 | Hung | 372/20 |
| 6,681,065 B1 | 1/2004 | Minasian et al. | 385/27 |
| 7,068,943 B2 * | 6/2006 | Korolev et al. | 398/148 |
| 7,167,614 B2 | 1/2007 | Mangir et al. | 385/27 |
| 7,454,101 B2 * | 11/2008 | Jones | 385/27 |
| 7,587,144 B2 * | 9/2009 | Ilchenko et al. | 398/183 |
| 8,098,991 B2 | 1/2012 | DeSalvo et al. | |
| 2007/0140705 A1 * | 6/2007 | Shpantzer et al. | 398/189 |
| 2009/0214223 A1 | 8/2009 | Chen et al. | |
| 2010/0046952 A1 * | 2/2010 | DeSalvo et al. | 398/115 |
| 2010/0230621 A1 * | 9/2010 | Rideout et al. | 250/551 |
| 2013/0028552 A1 | 1/2013 | DeSalvo et al. | |

OTHER PUBLICATIONS

"Dynamic Optical Transversal Filters based on Tunable Dispersion Fiber Bragg Grating"; Mora et al; Microwave Photonics; 2001.*

DeSalvo et al., "RF Photonic Notch Filters in High Dynamic Range Links," Manuscript from SPIE Defense, Security + Sensing Talk, Apr. 14, 2009, Orlando, FL, 12 pages.

Gruner-Nielsen et al., "A Dispersion Compensating Fiber With a Factor 5 Improvement in Figure of Merit and a Factor 4.5 Improvement in Effective Area", IEEE, Mar. 2011, pp. 1-3.

Rasras et al., "Demonstration of a Fourth-Order Pole-Zero Optical Filter Integrated Using CMOS Processes", IEEE, vol. 25, No. 1, Jan. 2007, pp. 87-92.

Yan et al., "Tunable Photonic Microwave Bandpass Filter With Negative Coefficients Implemented Using an Optical Phase Modulator and Chirped Fiber Bragg Gratings", IEEE, vol. 25, No. 11, Nov. 2007, pp. 3283-3288.

* cited by examiner

US 8,897,607 B2

TUNABLE RF FILTER DEVICE USING OPTICAL WAVEGUIDES WITH DISPERSION SLOPES OF OPPOSITE SIGNS AND RELATED METHODS

FIELD OF THE INVENTION

The present invention relates to the field of radio frequency (RF) filtering, and, more particularly, to RF filtering with optical components and related methods.

BACKGROUND OF THE INVENTION

As wireless communications has become prevalent in society, it is not uncommon for two wireless communications devices to interfere with the operation of each other when operating within transmission range of each other. Indeed, this type of interference has become more frequent with increasing wireless connectivity permeating society, such as the use of cellular phones and mobile email devices. For example, when IEEE 802.11b (WiFi) wireless devices, for example, laptop computers, became readily available to the home consumer, "cordless" home telephones were capable of rendering the WiFi devices inoperable due to interference.

Interference is typically categorized into two types: narrowband interference and wideband interference. Narrowband interference includes forms of interference that are concentrated around a relatively small frequency bandwidth. Several common approaches to compensating for narrowband interference may include, for example, forward error correction (FEC), baseband coding (FHSS/DSSS spread spectrum), diversity in frequency and/or time, and signal cancellation.

Differently, wideband interference includes forms of interference that are spread out across a relatively large frequency bandwidth. Several common approaches to compensating for wideband interference may include, for example, FEC, adaptive data rate (modulation and channel bandwidth), adaptive power control, diversity in frequency and/or time, and signal cancellation.

Another common type of interference is self interference. Common causes of self interference may include, for example, collocation or frequency reuse. In particular, collocation may be caused by two wireless communication systems being deployed too closely together while frequency reuse may be caused by two wireless communication systems using the same frequency band/channel. Several approaches to compensating for self interference, which are available during planning and development stages of wireless communication systems, include, for example, installation (isolation between antennas), frequency planning, antenna pattern manipulation, synchronization of transmitters, and filtering (duplexing).

In particular, one filtering approach to narrow band interference may be to apply a notch filter to the received signal. The notch filter is a type of band-stop filter that includes a narrow stop band. In typical applications, when a communication system is subject to narrow-band interference, the stop band of the notch filter is tuned to the frequency of the narrow-band interference, thereby mitigating the effect of the narrow-band interference.

In some applications, it may be desirable to mitigate narrow-band interference from a relatively high-power interference source, for example, a jammer device. Typical RF notch filters may be applied in these applications, but they may suffer damage from the high-power interference source. One approach to this drawback may be a photonic implementation of an RF notch filter.

For example, U.S. Patent Application Publication No. 2010/0046952 to DeSalvo et al., also assigned to the present application's assignee, discloses an RF notch filter including photonic components. In particular, this RF notch filter comprises a modulator for modulating an optical carrier signal, and a pair of optical fibers receiving the modulated optical signal. Phase delay is introduced into one of the optical fibers by "lengthening" the optical fiber. The outputs of the optical fibers may be combined to notch filter an input signal via superposition. A potential drawback to this approach may be that this lengthening of one optical fiber may be cumbersome to implement on-the-fly. A potential drawback to typical optical notch filters may be sensitivity to polarization changes due to environmental conditions.

In particular, for the typical optical notch filter that uses a coherent optical source, the optical source may need to have a high degree of coherence. Moreover, the optical phase may need precise control mechanisms, which may add to the cost of the device. Also, coherent applications may be highly sensitive to the aforementioned polarization issue.

SUMMARY OF THE INVENTION

In view of the foregoing background, it is therefore an object of the present invention to provide a tunable RF filter device for effective notch filtering.

This and other objects, features, and advantages in accordance with the present invention are provided by a tunable RF filter device comprising a tunable optical source configured to generate an optical carrier signal, and a modulator coupled to the tunable optical source and configured to modulate the optical carrier signal with an RF input signal. The tunable RF filter device also includes first and second optical waveguides coupled to the modulator and having first and second dispersion slopes of opposite sign, and an optical-to-electrical converter coupled to the first and second optical waveguides and configured to generate an RF output signal with at least one frequency notch therein based upon the tunable optical source. For example, the first and second dispersion slopes may intersect at a desired frequency point in the desired frequency range. Advantageously, the tunable RF filter device may provide notch filtering of the RF input signal with deep spectral nulls.

In some embodiments, the tunable RF filter device may further comprise a controller coupled to the tunable optical source and configured to tune a frequency of the optical carrier signal over a desired frequency range. The controller may be configured to tune the frequency of the optical carrier signal to generate the RF output signal with the at least one frequency notch therein by causing interference between outputs of the first and second optical waveguides.

Moreover, the optical-to-electrical converter may include first and second optical detectors coupled respectively to the first and second optical waveguides, and a combiner coupled to the first and second optical detectors. For example, the first and second optical waveguides may comprise first and second optical fibers. The tunable optical source may comprise a tunable continuous wave laser. The tunable RF filter device may also comprise an antenna coupled to the modulator and configured to generate the RF input signal. In certain embodiments, the modulator may comprise a dual-output Mach-Zehnder modulator.

Another aspect is directed to a method of RF filtering. The method comprises generating an optical carrier signal using a tunable optical source, modulating the optical carrier signal with an RF input signal using a modulator coupled to the tunable optical source and first and second optical waveguides coupled to the modulator and having first and second dispersion slopes of opposite sign, and generating an RF output signal with at least one frequency notch therein based upon the tunable optical source using an optical-to-electrical converter coupled to the first and second optical waveguides.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
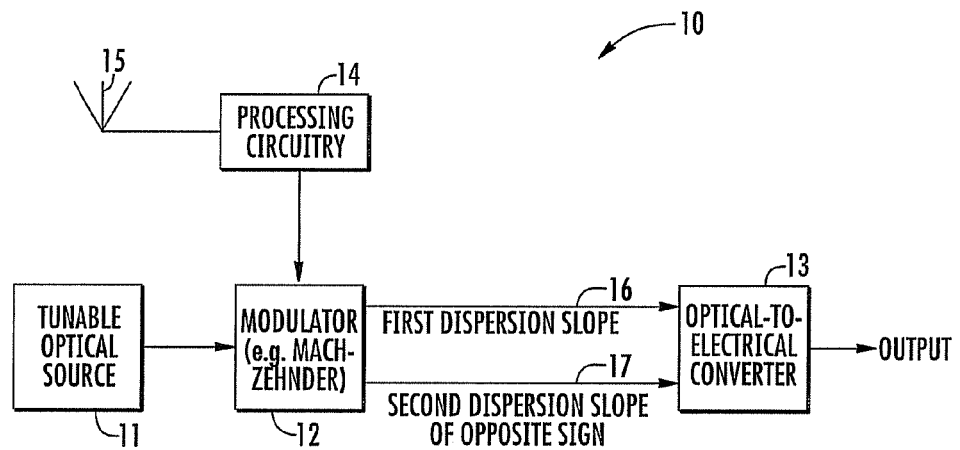
FIG. 1 is a schematic diagram of a tunable RF filter device, according to the present invention.

Referring initially to FIG. 1, a tunable RF filter device 10 according to the present invention is now described. The tunable RF filter device 10 illustratively includes an antenna 15, and processing circuitry 14 downstream therefrom for providing an input RF signal. For example, the processing circuitry 14 may comprise a receiver module.

The tunable RF filter device 10 includes a tunable optical source 11 configured to generate an optical carrier signal, and a modulator 12 coupled to the tunable optical source and configured to modulate the optical carrier signal with the RF input signal. For example, the tunable optical source 11 may comprise a tunable continuous wave laser, a diode laser, etc. The tunable RF filter device 10 includes first and second optical waveguides 16-17 coupled to the modulator 12 and having first and second dispersion slopes of opposite sign. Particularly, the modulator 12 generates a modulated optical signal and transmits the modulated optical signal into the first and second optical waveguides 16-17, i.e. the modulator is a dual output variant. As will be appreciated by those skilled in the art, the dispersion slope is a characteristic that governs induced phase delay as an optical signal travels through a medium varied over frequency, for example, a signal with a wavelength of 1525 nm may experience phase delay of 200 ps/nm.

The first and second optical waveguides 16-17 may comprise optical fibers, but of course, other waveguides may be used. In advantageous embodiments, the first and second optical waveguides 16-17 comprise photonic crystal fibers, which may be tailored to yield a wide tuning range over short fiber lengths. More specifically, with regards to the dispersion slopes of the first and second optical waveguides 16-17, the first slope may be negative and the second slope may be positive, or vice versa, or one of the first and second slopes may be zero while the other is either positive or negative and this permutation is also considered to be of opposite sign. In other words, as the modulated optical signal travels simultaneously through the first and second optical waveguides 16-17, the paths impart opposite shifts in phase at a respective frequency.

Figure 4:
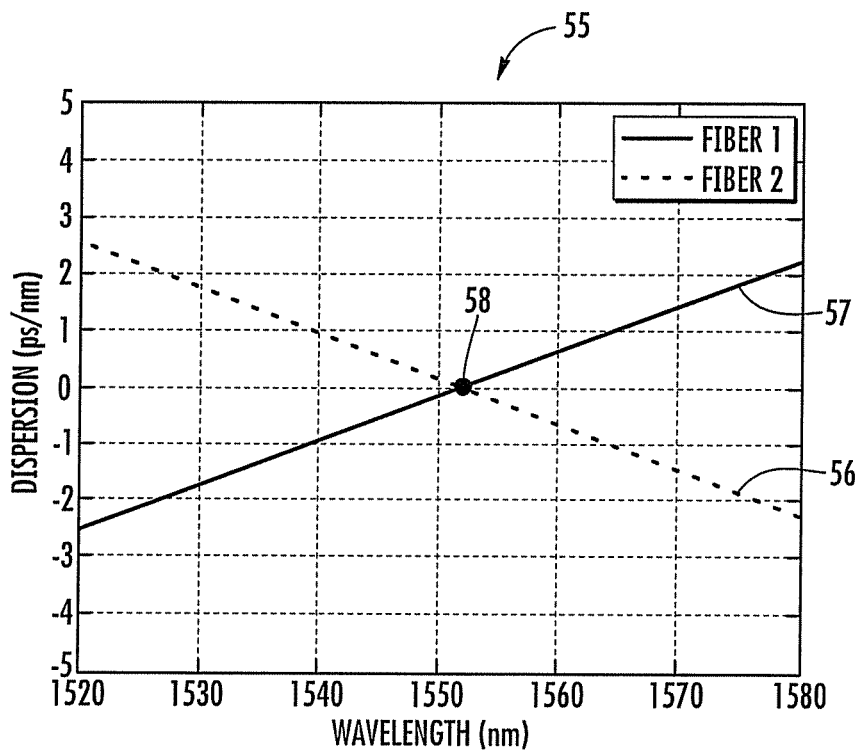
FIG. 4 is a diagram of the dispersion slopes of the waveguides of the tunable RF filter device of FIG. 2.

Referring briefly to FIG. 4 and diagram 55, illustrative examples of the first and second dispersion slopes 56-57 of opposite sign are shown. Since the first and second dispersion slopes are negative and positive, respectively, the slopes intersect at the point corresponding to an optical wavelength that produces no frequency notches in the RF spectrum. These exemplary dispersion slopes are calculated using an assumed optical fiber dispersion of 4×10-6 ps/nm/km at a wavelength of 1552 nm and a dispersion slope of ±0.08 ps/nm2/km with 1 km of fiber length.

Referring now once again to FIG. 1, the tunable RF filter device 10 includes an optical-to-electrical converter 13 coupled to the first and second optical waveguides 16-17 and is configured to generate an RF output signal with one or more frequency notches therein. The frequency notches in the modulated optical signal are generated by way of destructive interference (superposition) of the modulated optical signals output from the first and second optical waveguides 16-17. Advantageously, the frequency notches are selectively adjusted by varying the frequency of the optical carrier signal via the tunable optical source 11. Also, in some embodiments, the depth of the frequency notches are selectively adjusted by varying the optical power balance between arms of the modulator 12, as would be appreciated by those skilled in the art.

Figure 2:
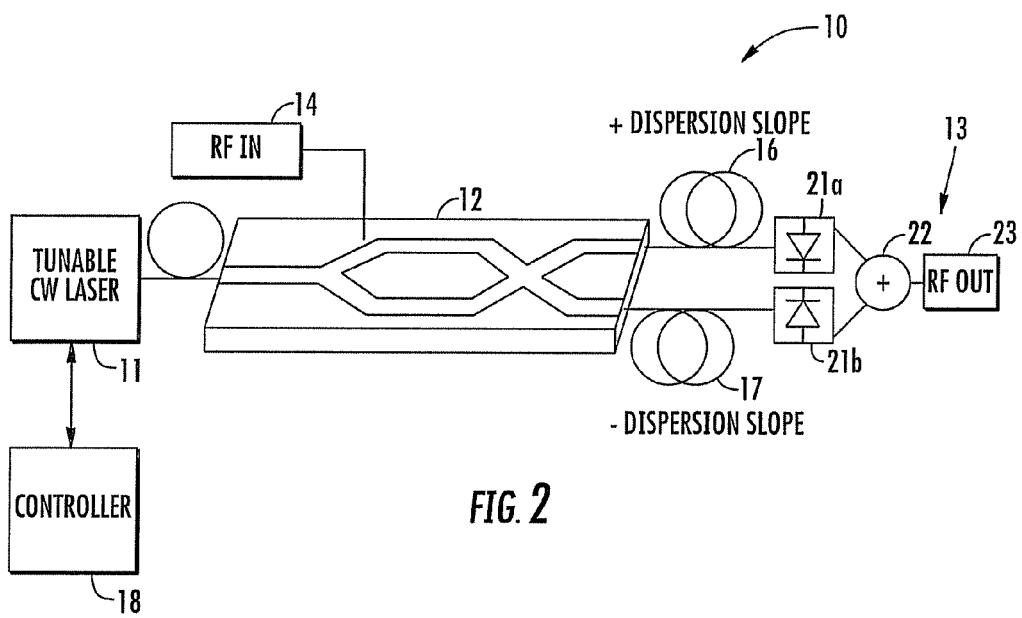
FIG. 2 is a detailed schematic diagram of the tunable RF filter device from FIG. 1.

Referring now to FIG. 2, the tunable RF filter device 10 is described in detail and includes a controller 18 coupled to the tunable optical source 11, illustrated as a continuous wave laser, and configured to cooperate therewith to tune the frequency of the optical carrier signal as needed for an application. Moreover, the optical-to-electrical converter 13 illustratively includes first and second optical detectors 21a-21b, which in some embodiments may be balanced, coupled respectively to the first and second optical waveguides 16-17, a combiner 22 (e.g. optical fiber coupler) coupled to the first and second optical detectors, and an RF output module 23 performing any needed finishing processing, such as decoder processing.

Helpfully, in balanced detector 21a-21b embodiments, the link performance may be improved with a 6 dB gain increase and with common-mode noise cancellation. This occurs by subtracting the output of two photodetectors 21a-21b: if the signals at each detector are exactly out of phase, they add when the detector outputs are subtracted. Common-mode noise is always in phase at both detectors 21a-21b, so the subtraction removes it. So a dual-output modulation device is required, and it must impart a 180° phase shift on one of the two outputs. The 6 dB of gain comes from the fact that in a modulator with a single output, half of the optical power is lost in the output coupling process, but in a dual-output modulator this optical power is retained. And 3 dB of optical power corresponds to 6 dB of RF power.

Also, the tunable RF filter device 10 may not be subject to the polarization sensitivity of typical optical devices since the balanced detectors 21a-21b convert the optical signals to electrical signals before interference occurs. In the illustrated embodiment, the modulator 12 comprises a dual-output Mach-Zehnder modulator. Of course, other suitable optical modulator types may be used.

Figure 3:
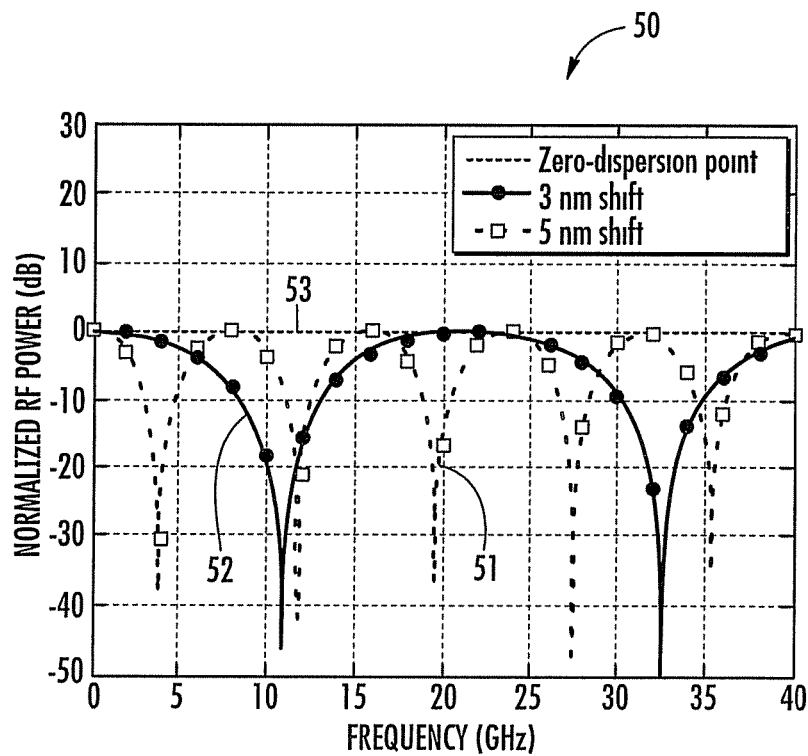
FIG. 3 is a diagram of the transfer characteristics of the tunable RF filter device of FIG. 2.

Referring now additionally to FIG. 3, a diagram 50 illustrates the transfer characteristics of the tunable RF filter device 10 as the frequency of the optical carrier signal is varied by the tunable optical source 11. The diagram 50 includes a curve 53 representing the zero dispersion point 58 (FIG. 4), i.e. when the interference from combining the modulated optical signals from the first and second optical waveguides 16-17 cancel each other out (flat transfer characteristic). Advantageously, the tunable optical source 11 can be tuned to provide the flat transfer characteristic, thereby providing an optical link with no filtering. The diagram 50 illustratively includes a curve 52 representing a 3 nm shift of the optical carrier signal from the zero dispersion point 58, and a curve 51 representing a 5 nm shift of the optical carrier signal from the zero dispersion point 58. Advantageously, the shifts in the optical carrier signal may provide versatility as the frequency notches can be adjusted depending on the application. As will be appreciated by those skilled in the art, this may be helpful in interference mitigation applications, for example, co-site interference mitigation. Also, as the skilled person will appreciate, the tunable RF filter device 10 may be used for moving object identification in radar applications and other typical digital signal processing applications.

Advantageously, the tunable RF filter device 10 may push the frequency limitations from solely RF components technology to the active photonic device realm. That is, the ability to create frequency notches over a wide bandwidth or at very high frequencies—a constant challenge for RF components—is not limited by the physical process of contrasting dispersion slopes, but would only be restricted by the frequency limitations of the modulator 12 and balanced detector 21a-21b. The periodic spacing and depth of the frequency notches is the same at 1 GHz as it is at 100 GHz. More so, the tunable RF filter device 10 is able to attenuate potential inference sources by more than 40 dB with little to no impact on a signal or signals of interest (SOI).

Another aspect is directed to a method of RF filtering. The method comprises generating an optical carrier signal using a tunable optical source 11, modulating the optical carrier signal with an RF input signal using a modulator 12 coupled to the tunable optical source and first and second optical waveguides 16-17 coupled to the modulator and having first and second dispersion slopes of opposite sign, and generating an RF output signal with at least one frequency notch therein based upon the tunable optical source using an optical-to-electrical converter 13 coupled to the first and second optical waveguides.

Figure 5:
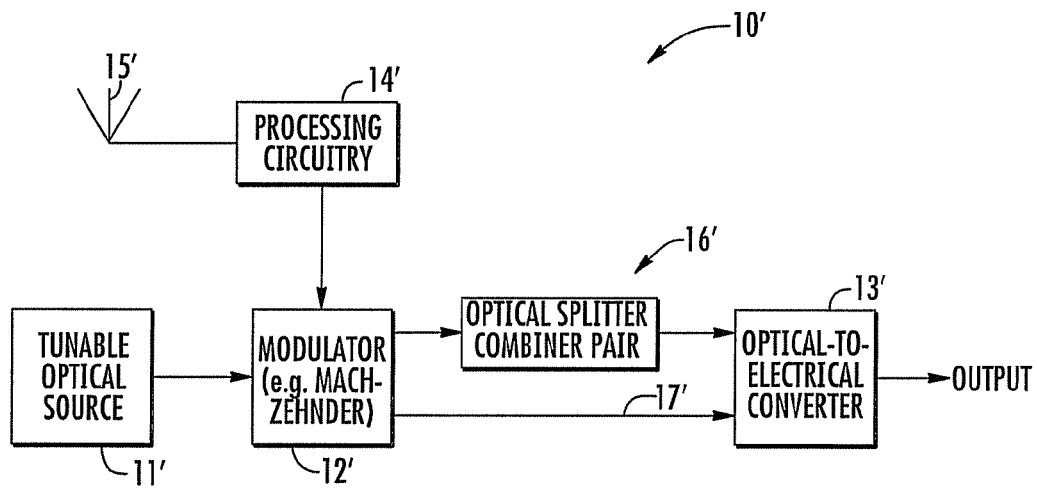
FIG. 5 is a schematic diagram of another embodiment of the tunable RF filter device, according to the present invention.

Referring now to FIG. 5, another embodiment of the tunable RF filter device 10' is now described. In this embodiment of the tunable RF filter device 10', those elements already discussed above with respect to FIGS. 1-2 are given prime notation and most require no further discussion herein. This embodiment differs from the previous embodiment in that the tunable RF filter device 10' includes first and second optical waveguide 16'-17' paths coupled to the modulator 12' and having first and second dispersion slopes of opposite sign, the first optical waveguide path illustratively including an optical splitter and combiner pair therein. Although illustrated as a typical waveguide, it should be appreciated that the second optical waveguide path 17' may also comprise an optical splitter and combiner pair therein, i.e. each of the first and second optical waveguide paths 16'-17' may comprise an optical splitter and combiner pair.

Figure 6:
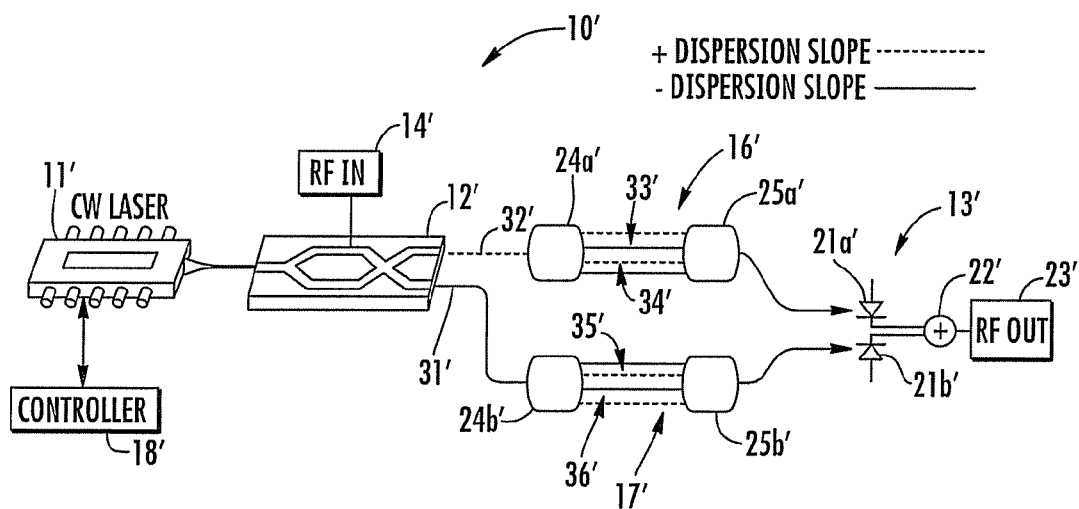
FIG. 6 is a detailed schematic diagram of the tunable RF filter device from FIG. 5.

Referring now additionally to FIG. 6, the tunable RF filter device 10' illustratively includes one optical splitter and combiner pair in each of the first and second optical waveguide paths 16'-17'. Each of the splitters 24a'-24b' includes a 1×4 splitter, and each of the combiners 25a'-25b' includes a 4×1 combiner, but of course, other configurations may be used, for example, 1×2, 1×n. As shown, the first and second optical waveguides 31'-32' couple the modulator 12' to the optical splitters 24a'-24b', the waveguide pair having dispersion slopes of opposite sign.

Moreover, the first optical splitter and combiner pair 24a', 25a' is coupled therebetween with a pair of waveguides 33'-34', each pair also comprising waveguides of opposite dispersion slopes. The second optical splitter and combiner pair 24b', 25b' is coupled therebetween with a pair of waveguides 35'-36', each pair also comprising waveguides of opposite dispersion slopes.

Figure 7:
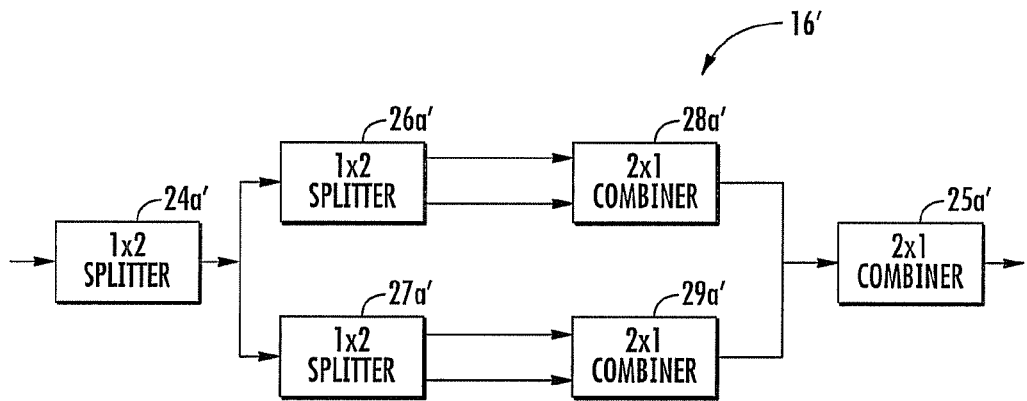
FIG. 7 is a schematic diagram of another embodiment of the optical waveguide path from the tunable RF filter device from FIG. 5.

Referring briefly and additionally to FIG. 7, another embodiment of the first optical waveguide path 16' is now described. In this embodiment, the first optical waveguide path 16' includes an optical splitter 24a' coupled in series to a plurality of parallel optical splitters 26a' and 27a', and a corresponding optical combiner 25a' coupled in series to a plurality of parallel optical combiners 28a' and 29a' downstream from the optical splitters. In other embodiments (not shown), the second optical waveguide path 17' may similarly comprise a plurality of optical splitters and a plurality of optical combiners.

Advantageously, the combination of the optical splitters and the combiners deepens the null of the notch filtering. Moreover, the pass band of the tunable RF filter device 10' is broadened, which overcomes the cosine squared limitation of the signal bandwidth. As in the above embodiments, the frequency of the notch filtering may be readily manipulated by changing the frequency of the optical carrier signal.

Figure 8:
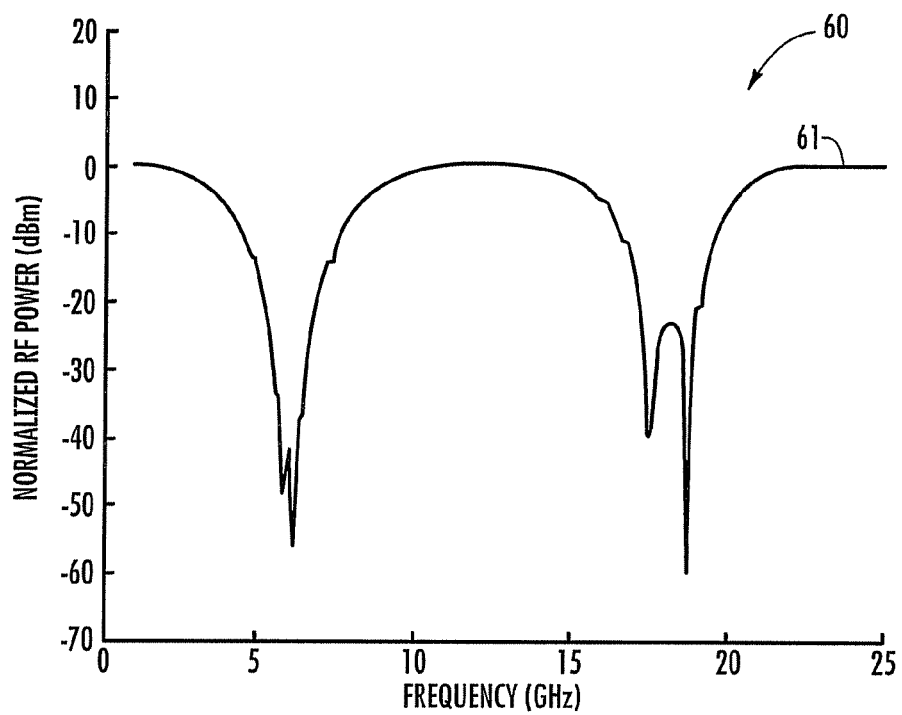
FIG. 8 is a diagram of the transfer characteristics of the tunable RF filter device of FIG. 6.

Referring now to FIG. 8, a diagram 60 illustrates the transfer characteristics of the tunable RF filter device 10'. The diagram 60 illustratively includes a curve 61 illustrating the transfer characteristics up to 25 GHz, and demonstrates two desirable deep nulls at approximately 6 GHz and 19 GHz with a wider pass band than the typical cosine squared response, based on a simulation of a system similar to that depicted in FIG. 6.

Another aspect is directed to a method of RF filtering. The method includes using a tunable optical source 11' to generate an optical carrier signal, and using a modulator 12' coupled to the tunable optical source to modulate the optical carrier signal with an RF input signal. The method may also include using first and second optical waveguide paths 16'-17' coupled to the modulator 12' and having first and second dispersion slopes of opposite sign, at least one of the first and second optical waveguide paths comprising at least one optical splitter and combiner pair therein, and using an optical-to-electrical converter 13' coupled to the first and second optical waveguide paths to generate an RF output signal with at least one frequency notch therein based upon the tunable optical source.

Other features relating to optical devices are disclosed in co-pending application Ser. No. 13/189,810 "TUNABLE RF FILTER DEVICE USING OPTICAL WAVEGUIDE PATHS WITH SPLITTER AND COMBINER PAIRS AND RELATED METHODS," incorporated herein by reference in its entirety.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A tunable Radio Frequency (RF) filter device comprising:
   a tunable optical source configured to generate an optical carrier signal;
   a modulator coupled to said tunable optical source and configured to modulate the optical carrier signal with an RF input signal;
   first and second optical waveguides coupled to said modulator and having first and second dispersion slopes of opposite sign; and
   an optical-to-electrical converter coupled to said first and second optical waveguides and configured to generate an RF output signal with at least one frequency notch therein based upon said tunable optical source and the first and second dispersion slopes of opposite sign.

2. The tunable RF filter device of claim 1 further comprising a controller coupled to said tunable optical source and configured to tune a frequency of the optical carrier signal over a desired frequency range.

3. The tunable RF filter device of claim 2 wherein said controller is configured to tune the frequency of the optical carrier signal to generate the RF output signal with the at least one frequency notch therein by causing interference between outputs of said first and second optical waveguides.

4. The tunable RF filter device of claim 2 wherein the first and second dispersion slopes intersect at a desired frequency point in the desired frequency range.

5. The tunable RF filter device of claim 1 wherein said optical-to-electrical converter comprises:
   first and second optical detectors coupled respectively to said first and second optical waveguides; and
   a combiner coupled to said first and second optical detectors.

6. The tunable RF filter device of claim 1 wherein said first and second optical waveguides comprise first and second optical fibers.

7. The tunable RF filter device of claim 1 wherein said tunable optical source comprises a tunable continuous wave laser.

8. The tunable RF filter device of claim 1 further comprising an antenna coupled to said modulator and configured to provide the RF input signal.

9. The tunable RF filter device of claim 1 wherein said modulator comprises a dual-output Mach-Zehnder modulator.

10. A tunable Radio Frequency (RF) filter device comprising:
    a tunable optical source configured to generate an optical carrier signal;
    a controller coupled to said tunable optical source and configured to tune a frequency of the optical carrier signal over a desired frequency range;
    a modulator coupled to said tunable optical source and configured to modulate the optical carrier signal with an RF input signal;
    first and second optical waveguides coupled to said modulator and having first and second dispersion slopes of opposite sign; and
    an optical-to-electrical converter configured to generate an RF output signal with at least one frequency notch therein based upon said tunable optical source and the first and second dispersion slopes of opposite sign, said optical-to-electrical converter comprising first and second optical detectors coupled respectively to said first and second optical waveguides, and a combiner coupled to said first and second optical detectors.

11. The tunable RF filter device of claim 10 wherein said controller is configured to tune the frequency of the optical carrier signal to generate the RF output signal with the at least one frequency notch therein by causing interference between outputs of said first and second optical waveguides.

12. The tunable RF filter device of claim 10 wherein the first and second dispersion slopes intersect at a desired frequency point in the desired frequency range.

13. The tunable RF filter device of claim 10 wherein said first and second optical waveguides comprise first and second optical fibers.

14. The tunable RF filter device of claim 10 wherein said tunable optical source comprises a tunable continuous wave laser.

15. The tunable RF filter device of claim 10 further comprising an antenna coupled to said modulator and configured to provide the RF input signal.

\* \* \* \* \*